(12) United States Patent
Castejon-Amenedo et al.

(10) Patent No.: US 7,421,462 B2
(45) Date of Patent: Sep. 2, 2008

(54) METHOD AND APPARATUS FOR GENERATING A RANDOM BIT STREAM

(75) Inventors: Jose Castejon-Amenedo, San Jose, CA (US); Richard A. McCue, Palo Alto, CA (US); Borislav H. Simov, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 761 days.

(21) Appl. No.: 10/706,172

(22) Filed: Nov. 12, 2003

(65) Prior Publication Data
US 2005/0102335 A1    May 12, 2005

(51) Int. Cl.
*G06F 1/02* (2006.01)

(52) U.S. Cl. .................................................. 708/250
(58) Field of Classification Search ................ 708/250, 708/251, 253, 254, 255, 256
See application file for complete search history.

(56) References Cited

U.S. PATENT DOCUMENTS

| | | | | |
|---|---|---|---|---|
| 4,713,787 | A | * | 12/1987 | Rapp ............................ 463/22 |
| 5,117,380 | A | * | 5/1992 | Tanagawa .................... 708/251 |
| 5,850,450 | A | * | 12/1998 | Schweitzer et al. ........... 380/30 |
| 6,728,740 | B2 | * | 4/2004 | Kelly et al. .................. 708/250 |

* cited by examiner

*Primary Examiner*—Chuong D Ngo

(57) ABSTRACT

A method and apparatus for generating a random bit stream. In one embodiment the method comprises accumulation of a plurality of hardware driven numbers from whence a portion of each hardware driven number is extracted. The extracted portions are combined to form a random bit stream.

30 Claims, 12 Drawing Sheets

METHOD AND APPARATUS FOR GENERATING A RANDOM BIT STREAM

BACKGROUND

Random numbers are difficult to generate in a digital environment that constitutes a computer platform. With the expansion of computer networking, the need for secure network transactions is on the rise. Secure network transactions often depend on encryption algorithms. These encryption algorithms require copious amounts of random bits as they operate to provide secure network transactions. Some encryption algorithms require truly random bits in order to provide high levels of security.

Truly random numbers are generally attainable through the use of a hardware-based random number generator embodied as a peripheral that can be accessed by a computer. A hardware-based random number generator typically relies on some natural phenomenon as a source of entropy. For example, one embodiment of a hardware-based random number generator uses radioactive decay as a source of entropy. Yet another example of a hardware-based random number generator relies on thermal noise as a source of entropy. The term "entropy" refers to the state of disorder in a system and is considered to be one metric by which the randomness of a random number is measured.

Computer systems have also relied on software-based random number generators. Software-based random number generators are not really random number generators at all. Rather, a software-based random number generator is capable of generating a value that is more properly referred to as a pseudo-random number. These software-based pseudo-random number generators have been commonly used in the past because they are inexpensive and because they generate fairly random values without relying on any specialized hardware. A sequence of integers generated by a pseudo-random number generator generally exhibits good statistical randomness. However, good statistical randomness may not be sufficient for use in all applications, e.g. in cryptographic applications. The problem with pseudo-random number generators is that they rely on a seed number to generate pseudo-random numbers. Because these software based pseudo-random number generators are "seed-based", the output they produce is predictable, if in fact the seed number is known. Hence, a software-based pseudo-random number generator is generally not capable of providing an unpredictable stream of random bits required by many of the encryption algorithms used to secure today's network communications.

There are also many hybrid solutions that utilize a low-entropy seed value for driving a software-based random number generator. For example, one such hybrid solution retrieves a hardware number from some hardware device that is readily accessible to a computer. According to one example, a real-time clock is used as the source of a hardware number. The hardware number, which is also known as a hardware driven number, is then read by a software-based pseudo-random number generator. The problem with these hybrid solutions is that the underlying source of a hardware driven number often exhibits some level of predictability. In the case where hardware driven numbers are retrieved from a real-time clock, the output of the software-based random number generator will exhibit a pattern that is driven by the periodicity of the real-time clock. Hence, the time values will give rise to predictability in the output of a pseudo-random number generator that uses those time values as a seed value.

This same underlying problem manifests itself in the output of a software-based pseudo-random number generator irrespective of the source of hardware driven numbers used as a seed number. Consider, for example, the use of a system-wide counter as a source of a hardware driven numbers wherein the system-wide counter is driven by a system clock. The periodicity of the counter will be manifest in the output of the software-based pseudo-random number generator because the actual instructions executed by a processor in the computer system are executed according to the same system clock that drives the system-wide counter.

SUMMARY

A method and apparatus for generating a random bit stream. In one embodiment the method comprises accumulation of a plurality of hardware driven numbers from whence a portion of each hardware driven number is extracted. The extracted portions are combined to form a random bit stream.

BRIEF DESCRIPTION OF THE DRAWINGS

Several alternative embodiments will hereinafter be described in conjunction with the appended drawings and figures, wherein like numerals denote like elements, and in which.

DETAILED DESCRIPTION

Figure 1:
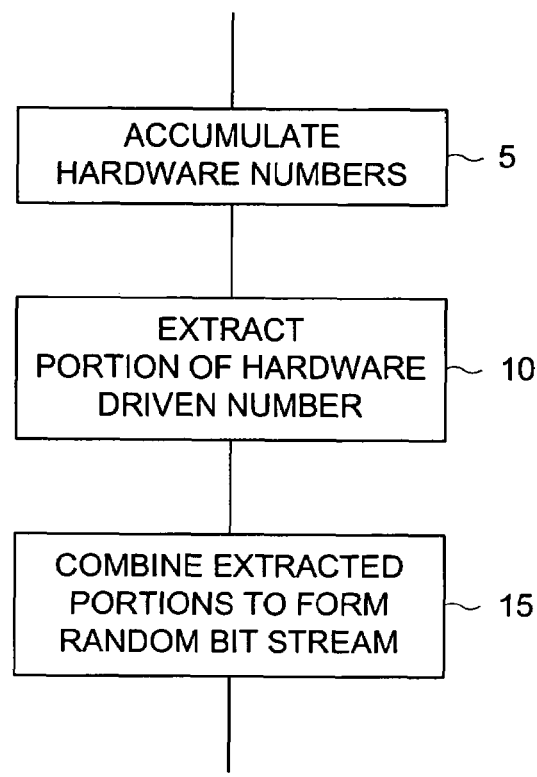
FIG. 1 is a flow diagram that depicts one example method for generating a random bit stream.

FIG. 1 is a flow diagram that depicts one example method for generating a random bit stream. According to this example method, a plurality of hardware driven numbers are accumulated (step 5). A portion of each hardware driven number is extracted (step 10). The extracted portions are combined to form a random bit stream (step 15). According to one alternative method, a hardware driven number comprises a plurality of bits and extraction of a portion of the number comprises extracting one or more bits from the hardware driven number. By using an extracted portion of a plurality of hardware driven numbers, additional entropy is tapped from the source. By varying the amount and type of extraction, varying degrees of entropy can be tapped from the source in accordance with the requirements of a consuming process, e.g. an encryption algorithm.

Figure 2:
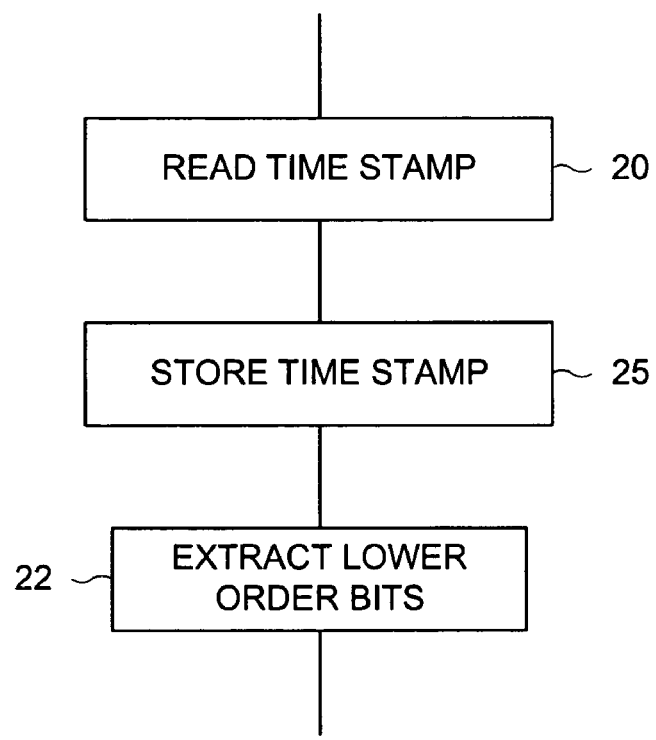
FIG. 2 is a flow diagram that depicts one example method for accumulating a plurality of hardware driven numbers.

FIG. 2 is a flow diagram that depicts one example method for accumulating a plurality of hardware driven numbers. According to this variation of the example method, a hardware driven number is obtained by reading a timestamp (step 20), e.g. from a real-time clock. The timestamp is then stored (step 25). This process is repeated so as to accumulate a plurality of hardware driven numbers, each comprising a timestamp. According to this variation of the example method, one or more of the lower order bits of a timestamp are extracted (step 22). In this circumstance, extraction of the lower order bits results in random numbers that exhibit sufficient entropy for use in encryption algorithms such as the Advanced Encryption Standard (AES) algorithm.

Figure 3:
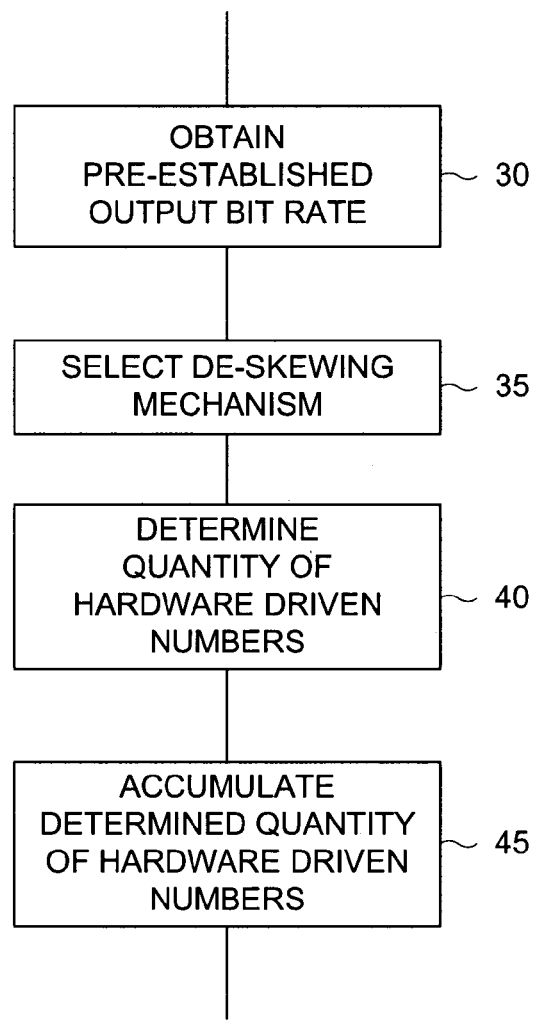
FIG. 3 depicts one alternative illustrative method for accumulating a plurality of hardware driven numbers.

FIG. 3 depicts one alternative illustrative method for accumulating a plurality of hardware driven numbers. In order to be useful, a random bit stream must exhibit some output bit rate that is dictated by a user process, e.g. an encryption process. The encryption process, in turn, may dictate a pre-established output bit rate based on the need to secure some amount of data at a prescribed bandwidth. Hence, one example method first obtains a pre-established output bit rate (step 30). In many cases, a random bit stream generated according to this method embodiment may exhibit some level of uniformity. Where the output random bit stream does not exhibit sufficient uniformity, one example method provides for de-skewing the output random bit stream to achieve greater uniformity. Uniformity refers to a substantially equal distribution of ones and zeros in the bit stream over some period of time. A de-skewing mechanism, according to one example method, is applied to the bit stream in order to improve uniformity. One example of a de-skewing mechanism discards some number of bits in order to improve uniformity. When such a de-skewing mechanism is utilized, there is an efficiency associated with the de-skewing process. Hence, the resultant random bit stream may be of a lesser output bit rate than the random bit stream operated on by the de-skewing mechanism. Consequently, once a de-skewing mechanism is selected (step 35), a quantity of hardware driven numbers can be determined (step 40) by considering the efficiency of the selected de-skewing mechanism and the pre-established output bit rate dictated by a consuming process. The determined quantity of hardware driven numbers is then accumulated (step 45) and used to generate a random bit stream.

Figure 4:
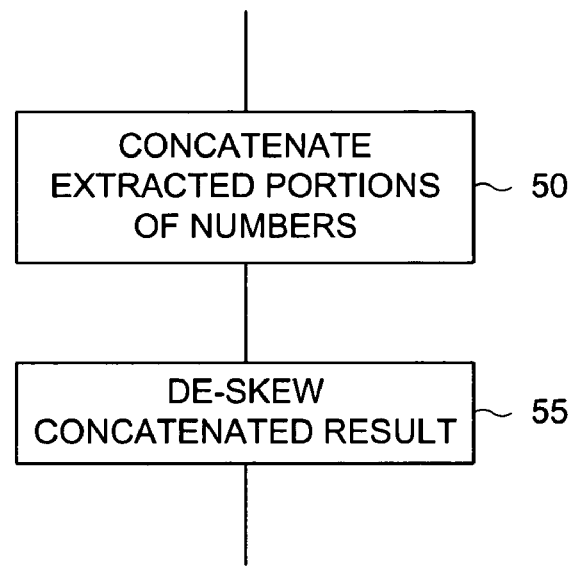
FIG. 4 depicts an illustrative method for combining extracted portions of hardware driven numbers to form a random bit stream.

FIG. 4 depicts an illustrative method for combining extracted portions of hardware driven numbers to form a random bit stream. According to one alternative method, extracted portions of hardware driven numbers are concatenated (step 50). As used herein concatenation is accomplished across a plurality of hardware driven numbers from the same bit position. The concatenated result may not be uniform in distribution of ones and zeros. Accordingly, this example method further comprises de-skewing the concatenated result in order to provide a more uniform distribution of random bits (step 55). According to one alternative method, de-skewing is accomplished by state transition mapping. Hence, a state is depicted according to a numerical value represented by the concatenated result. This state then drives a mapping table. A resultant numerical value, for example a value stored in the mapping table, represents random bits that exhibit a desired level of uniformity. Application of the de-skewing method need not be limited to this one form of de-skewing. Alternative de-skewing methods may be used that rely on various types of de-skewing mechanisms, including, but not limited to, transition mapping and exclusive-ORing of a number of bits in the concatenated result to form a single bit in a de-skewed result.

De-skewing, according to one variation, is accomplished on a concatenation of one bit position from a plurality of hardware driven numbers. For example, in the case where bits 1 and 0 are extracted from a hardware driven number, all bits in the "0" position are concatenated and then de-skewed. Then, all of the bits in the "1" position are concatenated and then de-skewed. Hence, according to one variation concatenation occurs on a bit-position basis. This is referred to as bit-wise concatenation.

Figure 5:
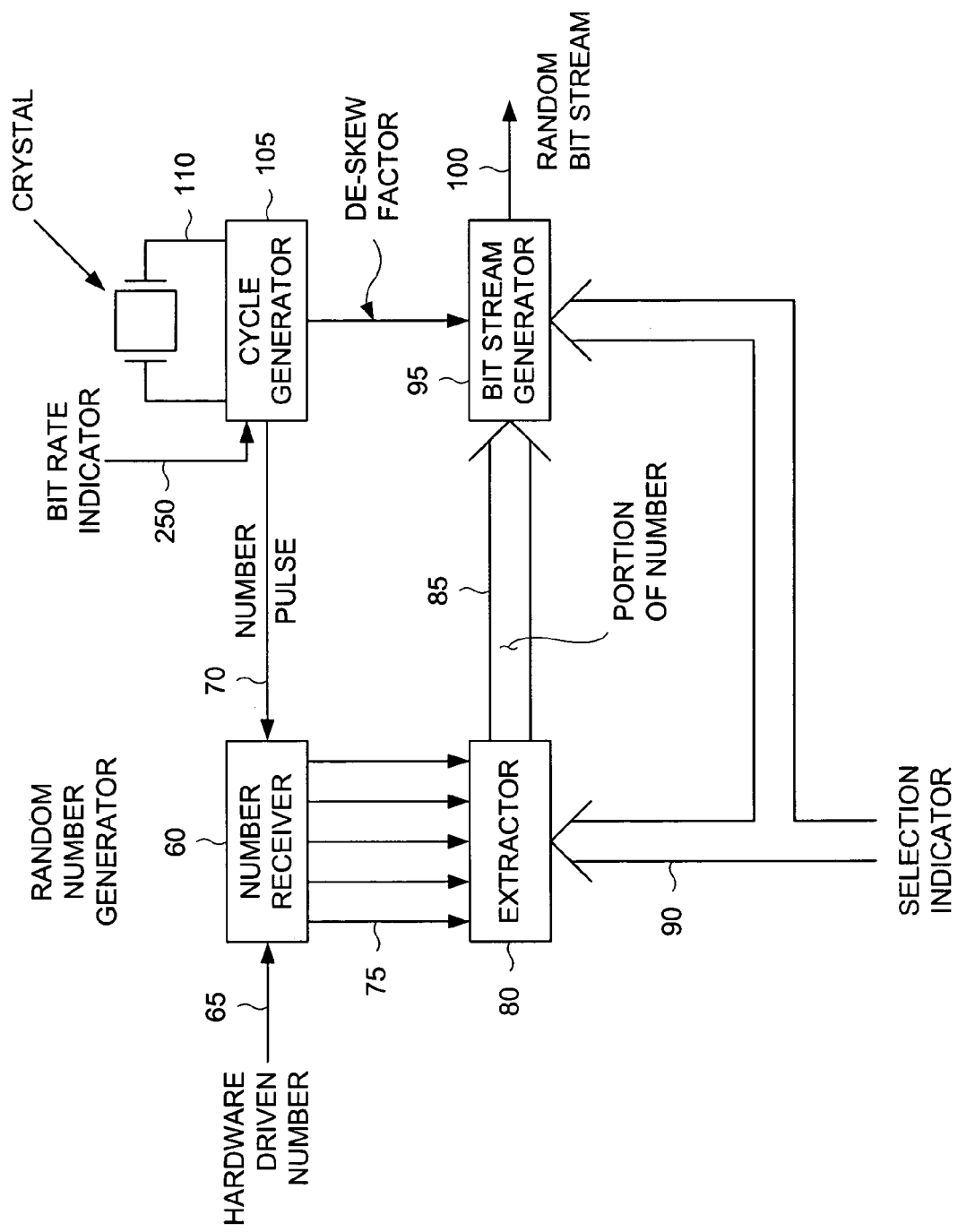
FIG. 5 is a block diagram that depicts one example embodiment of a random bit stream generator.

FIG. 5 is a block diagram that depicts one example embodiment of a random bit stream generator. According to this example embodiment, a random bit stream generator comprises a number receiver 60, an extractor 80 and a bit stream generator 95. Accordingly, the number receiver 60 is capable of receiving a hardware driven number 65. The extractor 80 is capable of extracting a portion 85 of a hardware driven number 75 received by the number receiver 60. The bit stream generator 95 is capable of generating a bit stream of random bits 100 according to the extracted portions of the hardware driven numbers. According to one example embodiment, the extractor 80 extracts a portion 85 of a hardware driven number 75 according to a selection indicator 90. The selection indicator 90, according to one example embodiment, is established empirically.

FIG. 5 also illustrates that the number receiver 60 is capable of receiving a hardware driven number 65 on a periodic basis. This periodic basis is established by a number pulse 70. The number pulse 70 constitutes a signal generated by a cycle generator 105. One alternative embodiment of a random bit stream generator further comprises said cycle generator 105. The cycle generator 105, according to yet another alternative embodiment, operates in a cyclical manner according to a time-base (e.g. a crystal 110).

Figure 6:
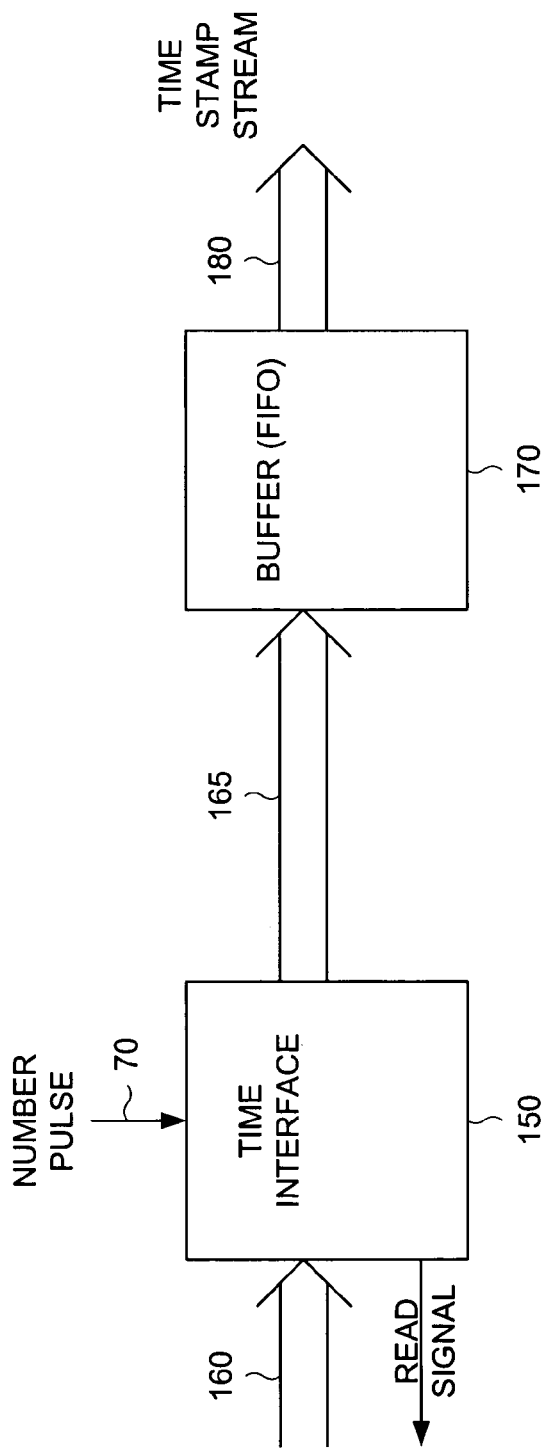
FIG. 6 is a block diagram of one illustrative alternative embodiment of a number receiver.

FIG. 6 is a block diagram of one illustrative alternative embodiment of a number receiver. According to this illustrative alternative embodiment, a number receiver comprises a time interface 150 and a buffer 170 capable of storing the timestamp 165 received by the time interface 150. The time interface 150, according to one example embodiment, retrieves a timestamp 160 from an external source (e.g. a real-time clock in a computer). The time interface 150, according to yet another alternative embodiment, obtains a new timestamp 160 on a periodic basis, the period of which is established by the number pulse 70. The time interface 150, according to yet another alternative embodiment, further is capable of generating a read signal that can be used to request data from a real time clock. The read signal is generated every time a number pulse 70 is received by the time interface 150. According to yet another example embodiment, the buffer 170 comprises a first-in-first-out buffer. The output of the buffer 170 constitutes a timestamp stream 180 that is used as a source of hardware driven numbers according to one method presented herein.

Figure 7:
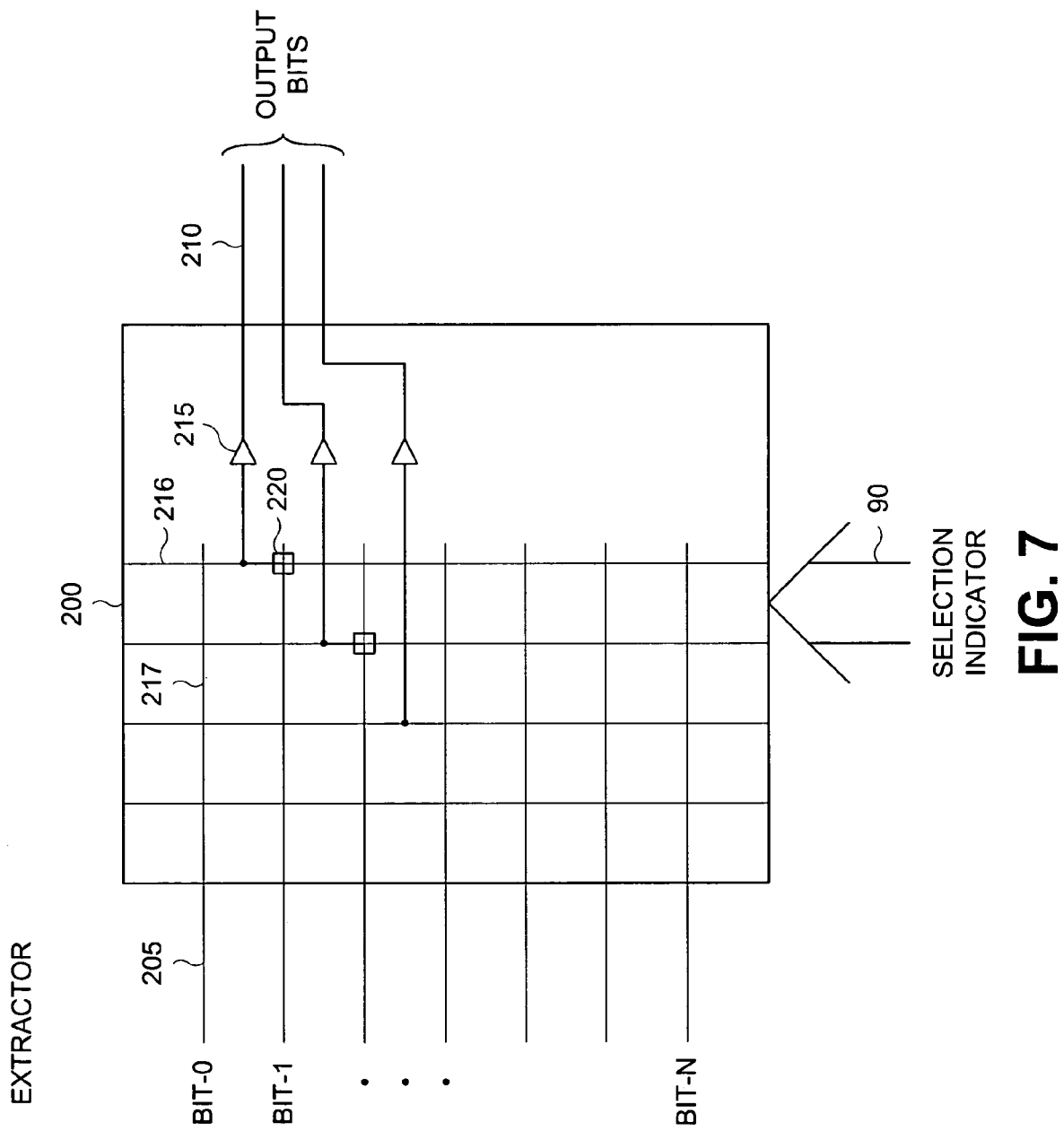
FIG. 7 is a block diagram of one illustrative embodiment of an extractor.

FIG. 7 is a block diagram of one illustrative embodiment of an extractor. According to this illustrative embodiment, an extractor 80 comprises a selection matrix (e.g. implemented in the form of a crossbar switch 200). The crossbar switch 200 comprises one or more selection inputs 205 for receiving bits constituting a hardware driven number. The crossbar switch 200 further comprises one or more outputs 210 for delivering bits selected from the selection inputs 205 according to a selection indicator 90. In operation, the selection indicator 90 controls the establishment of connection points 220 within the crossbar switch 200. Accordingly, one example embodiment of the crossbar switch 200 further comprises a buffer 215 for driving an output 210 wherein the input of the buffer 215 is connected to a selected input bit 205 by a connection point 220. Generally, the input of each buffer 215 is electrically connected to a vertical connection path 216. The vertical connection path 216 crosses over horizontal input paths 217 corresponding to the selection inputs 205.

During normal operation, the crossbar switch 200 is configured by the selection indicator 90 to propagate a data bit from a selection input 205 to one of the outputs 210. According to one example embodiment of a random bit stream generator, the selection indicator 90 is selected so as to cause the crossbar switch 200 to extract one or more of the least significant bits in a timestamp.

Figure 8:
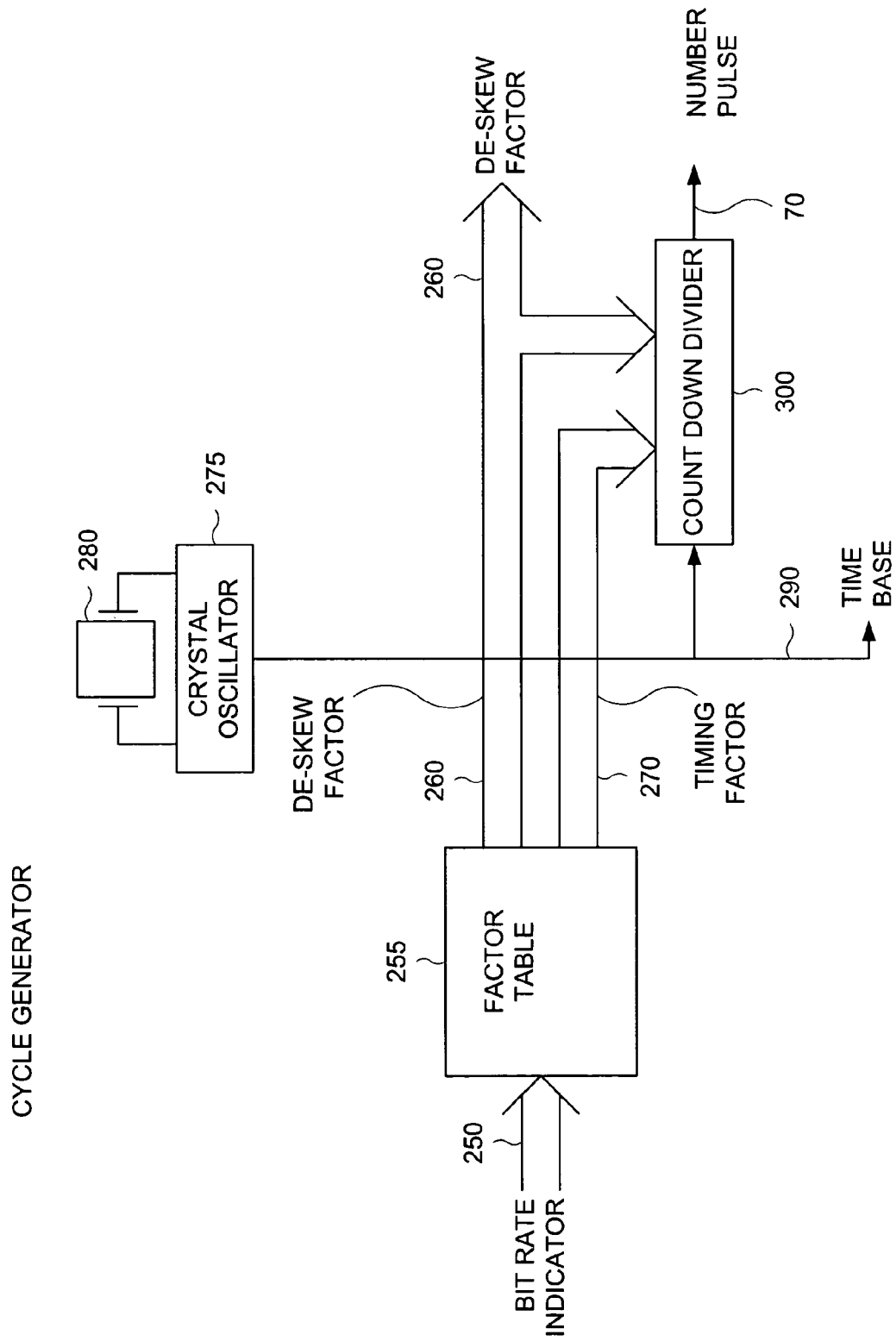
FIG. 8 is a block diagram of one example embodiment of a cycle generator.

FIG. 8 is a block diagram of one example embodiment of a cycle generator. According to this example embodiment, a cycle generator comprises a time base generator, e.g. a crystal oscillator 275, that operates at a frequency set by a crystal 280. It should be noted that any suitable time base generator may be used. The time base generator generates a time base signal 290. According to this example embodiment, the cycle generator further comprises a factor table 255. The factor table 255 generates a de-skewing factor 260. According to yet another example embodiment, the factor table 255 also generates a timing factor 270. It should be noted that the timing factor 270 is an optional factor that according to this alternative example embodiment is used as additional information by a countdown divider, as described infra. The factor table 255 generates the de-skewing factor 260 and the optional timing factor 270 according to a bit rate indicator 250. The bit rate indicator 250 is typically received from an external source, for example a consuming process that dictates the rate at which random bits are required to support a particular encryption algorithm.

The cycle generator of this example embodiment further comprises a countdown divider 300. The countdown divider 300 uses at least one of the de-skewing factor 260 and the timing factor 270 as a basis for reducing the time base 290 into a number pulse 70. The number pulse 70 is used to drive the rate at which hardware driven numbers are acquired by the number receiver 60 of the present embodiment. It should be noted that the factor table 255 is populated with empirical data that correlates the efficiency of a de-skewing mechanism associated with a de-skewing factor with a required output bit rate as specified by the bit rate indicator 250. Hence, the number pulse 70 is set to occur at a rate at which hardware driven numbers are received in sufficient quantity over a period of time so as to support an output random bit rate wherein said random bit rate has been de-skewed by a de-skewing mechanism as selected by the de-skewing factor 260.

Figure 9:
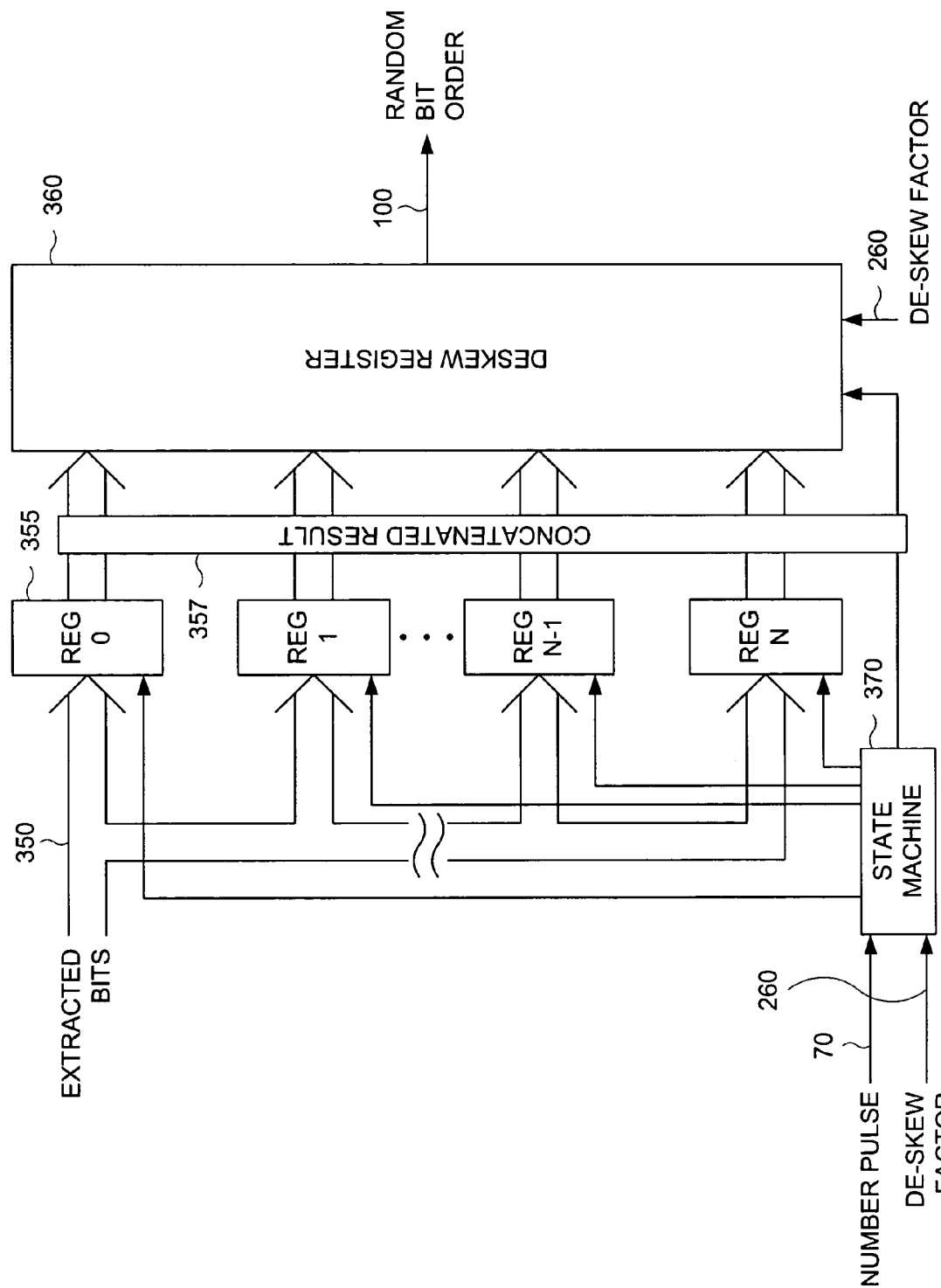
FIG. 9 is a block diagram of one example embodiment of a bit stream generator.

FIG. 9 is a block diagram of one example embodiment of a bit stream generator. According to this example embodiment, a bit stream generator 95 comprises a plurality of registers 355 each configured to accept an extracted portion of bits 350 from a plurality of hardware driven numbers. According to this example embodiment, the extracted bits 350 arrive from the extractor 80 on a periodic basis as dictated by the number pulse 70. The bit stream generator 95 further comprises a state machine 370 that, according to the de-skewing factor 260, causes successively extracted bits 350 to be loaded into individual registers 355 thereby resulting in a concatenated result 357. Said registers 355 serve a particular bit position thereby enabling bit-wise concatenation. The concatenated result 357 is presented to a de-skewing register 360 that further is included in this example embodiment of the bit stream generator 95. The de-skewing register 360 applies a de-skewing mechanism to the concatenated result 357 according to the de-skewing factor 260. The de-skewing register 360 further generates a random bit stream 100 that exhibits a desired level of uniformity.

Figure 10:
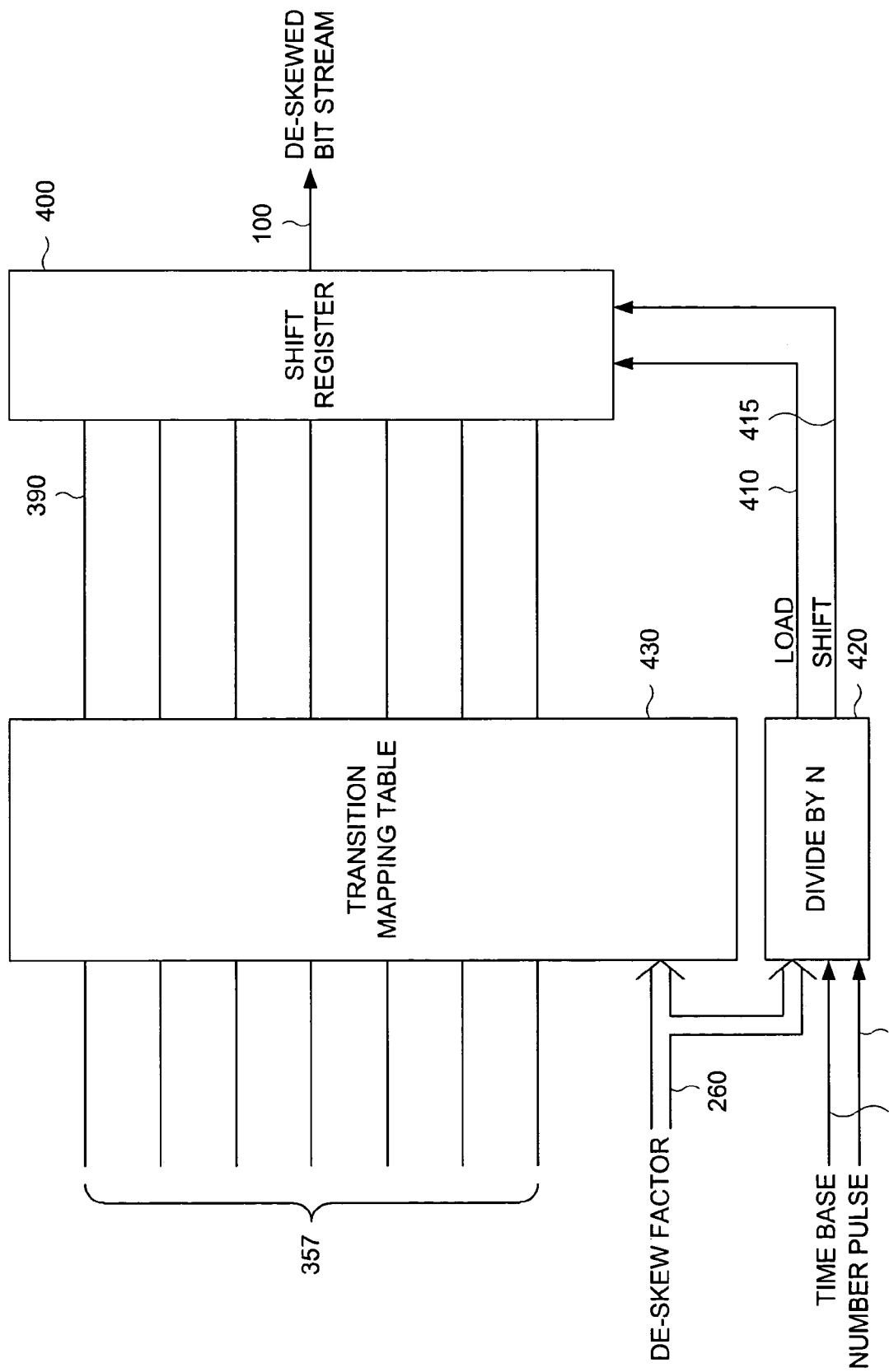
FIG. 10 is a block diagram that depicts the structure of one example embodiment of a de-skewing register.

FIG. 10 is a block diagram that depicts the structure of one example embodiment of a de-skewing register. According to this example embodiment, a de-skewing register 360 comprises a transition mapping table 430 and a shift register 400. According to this example embodiment, the transition mapping table 430 is populated with transition maps that are indexed according to a concatenated result 357 received from the plurality of registers 355 included in the bit stream generator 95. According to one alternative embodiment, the transition mapping table 430 is further indexed by a de-skewing factor 260. As a concatenated result 357 is presented to the transition mapping table, an output value is selected from the table wherein said output value comprises a random number that exhibits a desired level of uniformity in the quantity of ones and zeros present in the output value of the table. The de-skewing factor 260, according to one example embodiment of the de-skewing register 360, is used to indicate how many output bits 390 are valid for a particular concatenated result 357. Hence, only a portion of the output bits generated by the transition mapping table 430 may be valid. The number of output bits that are valid for a particular concatenated result 357 constitutes the efficiency of the de-skewing mechanism implemented in the transition mapping table 430 as selected by the de-skewing factor 260.

In operation, a counter 420 included in the de-skewing register 360 is configured according to the de-skewing factor 260. The de-skewing factor 260 is used to determined the quantity of valid bits that are present in the de-skewing register 360. The counter 420 operates in a periodic manner according to the time base signal 290 and uses the number pulse 70 to generate a load signal 410 and a shift signal 415. These signals control the shift register 400 so as to load a particular number of valid bits 390 from the transition mapping table 430. Once the bits are loaded into the shift register 400 according to be load signal 410, the bits are shifted out of the shift register 400 as a stream of de-skewed random bits 100. Shifting occurs according to the shift signal 415.

Figure 11:
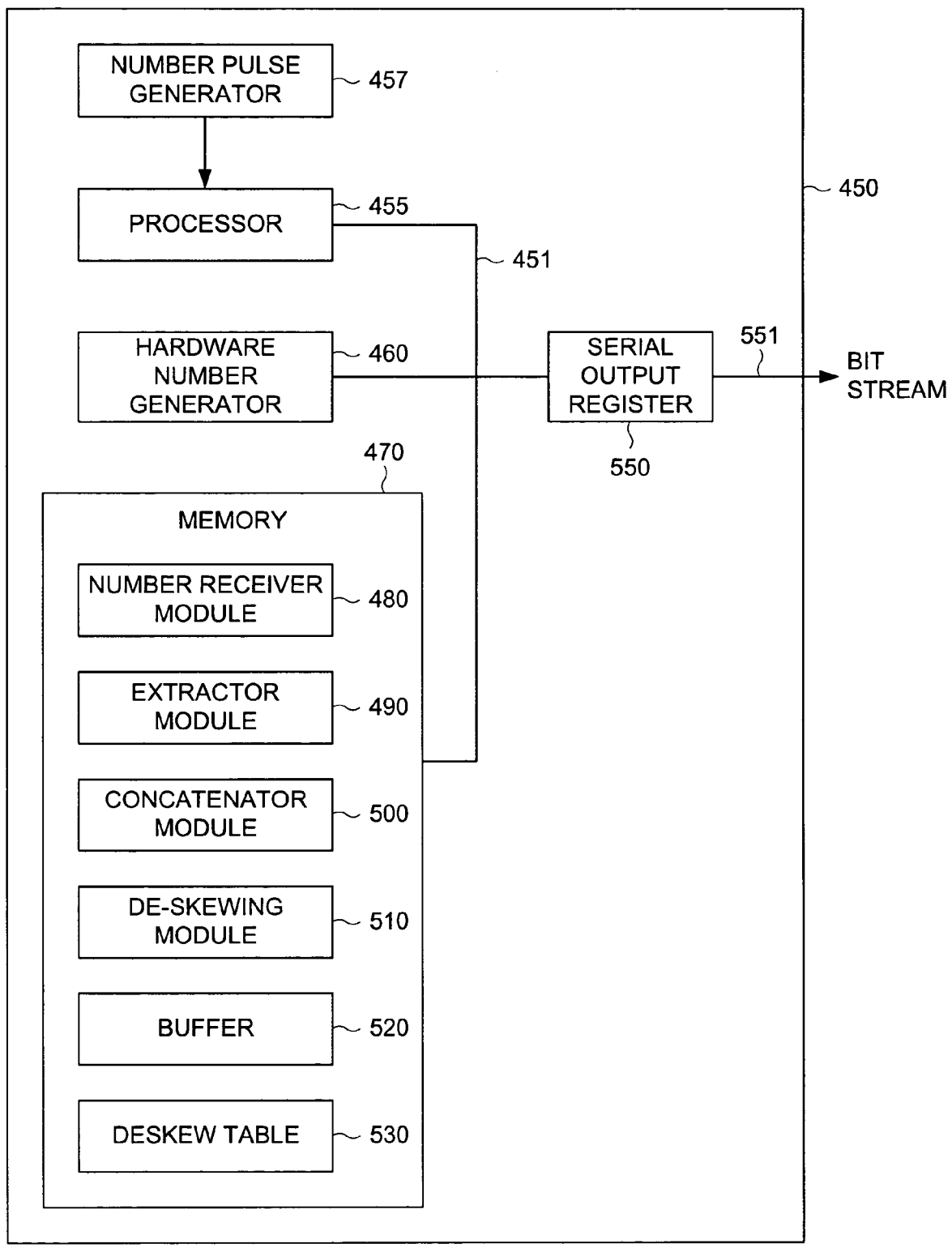
FIG. 11 as a block diagram that depicts one alternative example embodiment of a random bit stream generator.

FIG. 11 is a block diagram that depicts one alternative example embodiment of a random bit stream generator. According to this alternative example embodiment, a random bit stream generator comprises one or more processors 455 and a memory 470. These elements are connected by an internal data bus 451, also included in the random bit stream generator of the present embodiment. According to one alternative embodiment, a portion of the memory 470 is set aside as a buffer 520, which is used to store information according to the teaching described infra. This alterative example embodiment further comprises various functional modules each of which comprises an instruction sequence. For purposes of this disclosure, a functional module and its corresponding instruction sequence is referred to by a process name. The instruction sequence that implements the process name, according to one alternative embodiment, is stored in the memory 470. The reader is advised that the term "minimally causes the processor" and variants thereof is intended to server as an open-ended enumeration of functions performed by the processor as it executes a particular functional process (i.e. instruction sequence). As such, an embodiment where a particular functional process causes the processor to perform functions in addition to those defined in the appended claims is to be included in the scope of the claims appended hereto.

According to one example embodiment of a random number generator, instruction sequences that implement functional modules are stored in the memory 470 including a number receiver module 480, an extractor module 490 and a concatenator module 500. According to one alternative embodiment, an additional instruction sequence that implements a de-skewing module 510 is also included in the memory 470. In this case, a portion of the memory 470, according to one alternative embodiment, is used to store a de-skewing table 530.

The functional processes (and their corresponding instruction sequences) described thus far that enable generation of a random bit stream are, according to one alternative embodiment, imparted onto computer readable medium. Examples of such media include, but are not limited to, random access memory, read-only memory (ROM), CD ROM, floppy disks, and magnetic tape. This computer readable media alone or in combination can be used to convert a general-purpose computing platform into a device for generating a random bit stream according to the techniques and teachings presented herein.

According to one example alternative embodiment, the random bit stream generator further comprises a serial output register 550. The serial output register 550 is capable of accepting a digital value from the internal bus 451 and converting the digital value it receives from the internal data bus 451 into a bit stream 551. The random bit stream generator, according to yet another example embodiment, further comprises a number pulse generator 457. The number pulse generator 457 generates a periodic signal to the processor 455. This periodic signal, according to one example embodiment, is recognized as an interrupt by the processor 455. According to yet another example embodiment, the random bit stream generator further comprises a hardware number generator 460. According to yet another alternative embodiment, the hardware number generator comprises a real-time clock.

Figure 12:
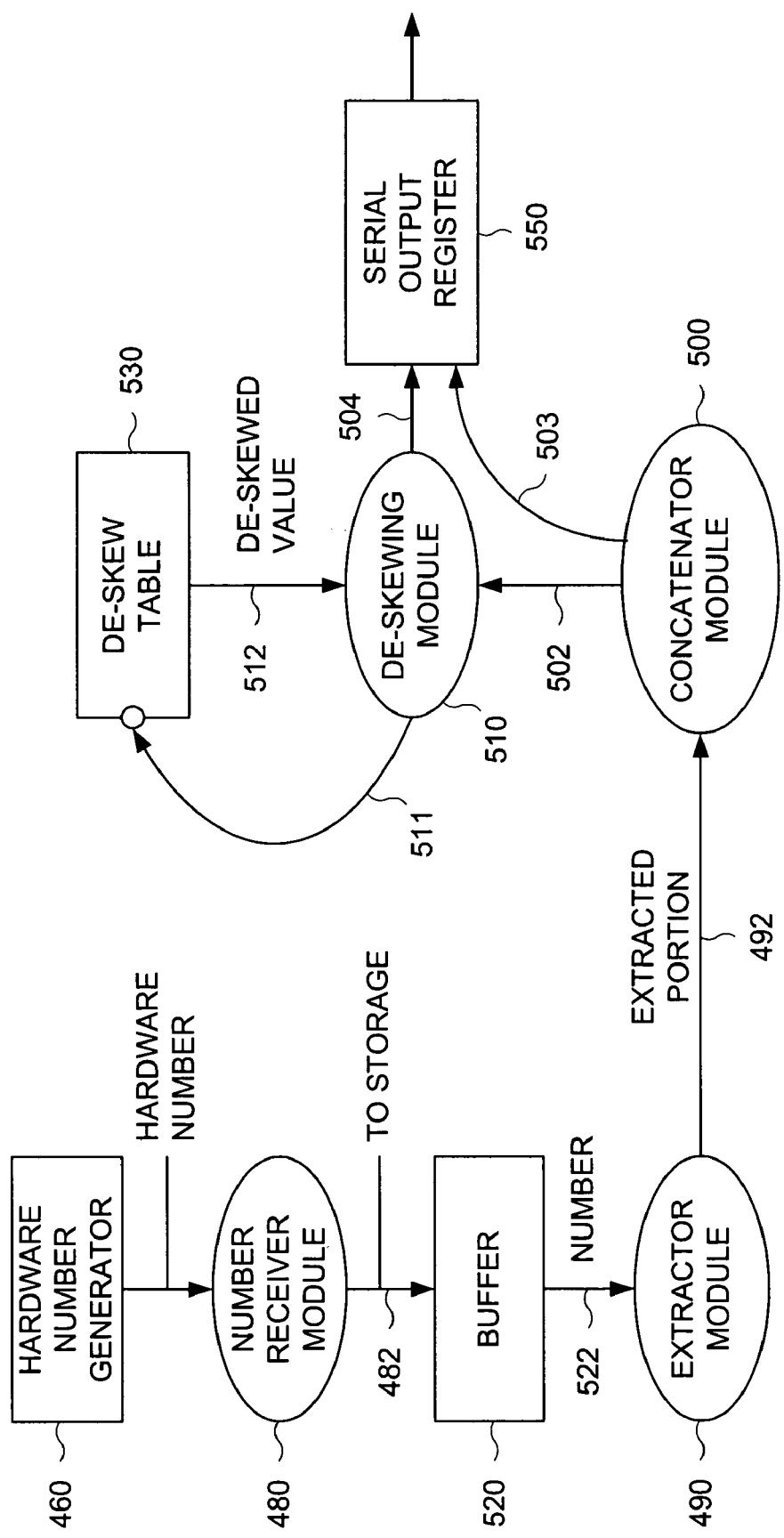
FIG. 12 is a data flow diagram that depicts the operation of one example embodiment of a random bit stream generator.

FIG. 12 is a data flow diagram that depicts the operation of one example embodiment of a random bit stream generator. According to this example embodiment, the number receiver module 480 is executed by the processor 455. When executed by the processor 455, the number receiver module 480 minimally causes the processor 455 to receive a hardware driven number. According to one alternative embodiment, the number receiver module 480 minimally causes the processor 455 to receive the hardware driven number from the hardware number generator 460. It should be noted that the processor 455, according to one alternative embodiment, executes the number receiver module 480 when it receives a number pulse signal from the number pulse generator 457 (e.g. as an interrupt service routine).

According to yet another alternative embodiment, the number pulse generator 457 is programmable, enabling control of the frequency at which a number pulse signal is generated by the number pulse generator 457. According to one embodiment, the number pulse generator 457 is programmed to generate a number pulse signal according to a pre-established output bit rate and according to a predefined de-skewing mechanism.

According to one alternative embodiment, the number receiver module 480, when executed by the processor 455, minimally causes the processor 455 to store a hardware driven number in the buffer region 520 of the memory 470. The processor 455 further executes the extractor module 490, which minimally causes the processor 455 to retrieve hardware driven numbers from the buffer region 520 and extract a portion of each number. The extractor module 490, when executed by the processor 455, further minimally causes the processor 455 to provide the extracted portion 492 of a hardware driven number to the concatenator module 500.

According to one example embodiment, the hardware number generator is capable of generating a timestamp. Accordingly, the number receiver module 480, when executed by the processor 455, minimally causes the processor 455 to retrieve a timestamp from the hardware number generator and to store the timestamp in the buffer region 520 included in the memory 470. In this case, one alternative embodiment of the extractor module 490 minimally causes the processor 455 to extract a portion of a hardware driven number by minimally causing the processor 455 to extract one or more lower order bits from the hardware driven number.

As the processor 455 executes the concatenator module 500, the concatenator module 500 minimally causes the processor 455 to concatenate extracted portions of hardware driven numbers. This process yields a concatenated result. According to one embodiment, the concatenator module 500 minimally causes the processor 455 to convey the concatenated result to the de-skewing module 510 (connection 502). In this event, the processor 455 executes the de-skewing module 510 which minimally causes the processor 455 to use the concatenated result as an index 511 into a de-skewing table 530 stored in the memory 470. The de-skewing module 510 then receives a de-skewed value 512 from the de-skewing table 530. The value received from the de-skewing table 530 or the original concatenated result generated by the concatenator module 500 is then made available to other consuming processes, for example an encryption algorithm. It should be noted, that according to one alternative embodiment, the concatenator module concatenates extracted bits on a bit-wise basis in accordance with the present method.

One alternative embodiment, as already noted, further comprises a serial output register 550. According to one alternative embodiment of the concatenator module 500, the concatenator module 500, when executed by the processor 455, further minimally causes the processor 455 to convey a concatenated result to the serial output register 550 (connection 503). According to one alternative embodiment of the de-skewing module 510, the de-skewing module 510, when executed by the processor 455, further minimally causes the processor 455 to convey (connection 504) to the serial output register 550 a de-skewed value 512 received from the de-skewing table 530. It should be noted that the de-skewing table 530 is populated with transition mapping values so that when indexed by a concatenated number results in a corresponding random number that exhibits a desired level of uniformity in the number of ones and zeros present in said result.

While this present method and apparatus have been described in terms of several alternative methods and exemplary embodiments, it is contemplated that alternatives, modifications, permutations, and equivalents thereof will become apparent to those skilled in the art upon a reading of the specification and study of the drawings. It is therefore intended that the true spirit and scope of the appended claims include all such alternatives, modifications, permutations, and equivalents except as limited by the prior art.

What is claimed is:

1. A method for generating a random bit stream comprising:
  accumulating a plurality of hardware driven numbers;
  extracting a portion of each hardware driven number, the portion less than the whole of each hardware driven number; and
  combining each extracted portion to form a random bit stream, wherein the random bit stream is used for encrypting data in a consuming process.

2. The method of claim 1 wherein accumulating a plurality of hardware driven numbers comprises:
reading a timestamp; and
storing the timestamp.

3. The method of claim 2 wherein extracting a portion of each hardware driven number comprises extracting one or more lower order bits from each hardware driven number.

4. The method of claim 1 wherein accumulating a plurality of hardware driven numbers comprises:
determining the quantity of hardware driven numbers required to achieve a pre-established output bit rate using a predefined de-skewing mechanism; and
accumulating the determined quantity of hardware driven numbers.

5. The method of claim 1 wherein extracting a portion of each hardware driven number comprises extracting one or more bits from each hardware driven number.

6. The method of claim 1 wherein combining each extracted portion comprises:
concatenating bits extracted from each number at a particular bit position; and
de-skewing the concatenated result in order to provide a uniform distribution of random bits.

7. An apparatus for generating a random bit stream comprising:
a number receiver that receives hardware driven numbers;
an extractor that extracts a portion of a hardware driven number, the portion less than the whole of the hardware driven number; and
a bit stream generator that generates a bit stream according to a plurality of extracted portions of the hardware driven numbers, wherein the bit stream is used for encrypting data in a consuming process.

8. The apparatus of claim 7 wherein the number receiver comprises:
time interface that receives a timestamp; and
buffer that stores the timestamp.

9. The apparatus of claim 8 wherein the extractor comprises a selection matrix that selects one or more of the least significant bits in the timestamp.

10. The apparatus of claim 7 further comprises a cycle generator that comprises:
time base generator that generates a time base;
translation table that generates a de-skewing factor according to a bit rate indicator; and
a count down divider that generates a number pulse by dividing the time base according to the de-skewing factor and wherein the translation table is populated with empirical data that correlates the efficiency of a de-skewing mechanism associated with the de-skewing factor and the bit rate indicator.

11. The apparatus of claim 7 wherein the extractor comprises:
one or more input ports, each for receiving a data bit;
one or more output ports, each for driving a data bit; and
cross-bar switch for connecting the data bit from the input port to at least one output port.

12. The apparatus of claim 7 wherein the bit stream generator comprises:
a plurality of registers that accept extracted portions of hardware driven numbers and present a bit-wise concatenated result;
a transition mapping table populated with de-skewing values that generates a de-skewed random number according to the concatenated result; and
a shift register that serializes the de-skewed random number.

13. A random bit stream generator comprising:
a processor configured to execute instructions;
a memory; and
instruction sequences stored in the memory comprising:
a number receiver module that, when executed by the processor, minimally causes the processor to retrieve a hardware driven number;
an extractor module that, when executed by the processor, minimally causes the processor to extract a portion of the hardware driven number; and
a concatenator module that, when executed by the processor, minimally causes the processor to generate a concatenated value by combining a plurality of extracted portions of hardware driven numbers in a bit-wise manner to produce a random number, wherein the random number is used for encrypting data in a consuming process.

14. The random bit stream generator of claim 13 further comprising a serializing output register capable of generating a serial bit stream according to at least one of the concatenated value and a de-skewed concatenated value.

15. The random bit stream generator of claim 13 further comprising a hardware number generator that generates a timestamp and wherein the number receiver module minimally causes the processor to:
retrieve a timestamp from the hardware number generator; and
store the timestamp in a buffer region in the memory.

16. The random bit stream generator of claim 15 wherein the extractor module minimally causes the processor extract a portion of a hardware driven number by extracting one or more lower order bits from a hardware driven number.

17. The random bit stream generator of claim 15 further comprising a number pulse generator that issues a number pulse signal to the processor and wherein the number receiver module minimally causes the processor to retrieve the hardware driven number from the hardware number generator according to the number pulse signal and wherein a period of the number pulse signal is selected according to a pre-established output bit rate using a predefined de-skewing mechanism.

18. The random bit stream generator of claim 13 wherein the extractor module minimally causes the processor to extract a portion of a hardware driven number by minimally causing the processor to extract one or more bits from the hardware driven number.

19. The random bit stream generator of claim 13 further comprising a de-skewing Module instruction sequence stored in the memory that, when executed by the processor, minimally causes the processor to de-skew the concatenated value.

20. A computer-readable medium having stored therein computer-executable functions for generating a random bit stream, comprising:
a number receiver instruction sequence that, when executed by a processor, minimally causes the processor to accumulate a plurality of hardware driven numbers;
an extractor instruction sequence that, when executed by the processor, minimally causes the processor to extract a portion of each hardware driven number; and
a concatenator instruction sequence that, when executed by the processor, minimally causes the processor to concatenate a plurality of extracted portions of the hardware driven numbers into a concatenated value in a bit-wise manner to produce a random number, wherein the random number is used for encrypting data in a consuming process.

21. The computer-readable medium of claim 20 wherein the number receiver instruction sequence minimally causes the processor to accumulate the plurality of hardware driven numbers by minimally causing the processor to:

read a timestamp from a hardware driven number generator; and store the timestamp in a memory.

22. The computer-readable medium of claim 21 wherein the extractor instruction sequence minimally causes the processor to extract the portion of each hardware driven number by minimally causing the processor to extract one or more lower order bits from the timestamp.

23. The computer-readable medium of claim 20 wherein the number receiver instruction sequence minimally causes the processor to accumulate the plurality of hardware driven numbers by minimally causing the processor to accumulate a quantity of hardware driven numbers over a period of time, wherein the quantity of hardware driven numbers accumulate over the period of time is selected according to a pre-established output bit rate and a predefined de-skewing mechanism.

24. The computer-readable medium of claim 20 wherein the extractor instruction sequence minimally causes the processor to extract the portion of each hardware driven number by minimally causing the processor to extract one or more bits from each hardware driven number.

25. The computer-readable medium of claim 20 further comprising a de-skewing instruction sequence that, when executed by a processor, minimally causes the processor to de-skew the concatenated value.

26. A random bit stream generator comprising:

means for accumulating a plurality of hardware driven numbers;

means for extracting a portion of each hardware driven number, the portion less than the whole of each hardware driven; and means for combining each extracted portion to form a random bit stream, wherein the random bit stream is used for encrypting data in a consuming process.

27. The random bit stream generator of claim 26 wherein the accumulating means comprises:

means for reading a timestamp; and means for storing the timestamp.

28. The random bit stream generator of claim 26 wherein the accumulating means comprises:

means for accumulating a selected quantity of hardware driven numbers over a period of time wherein the selected quantity is selected according to a pre-established output bit rate and a predefined de-skewing mechanism.

29. The random bit stream generator of claim 26 wherein the extracting means comprises a means for extracting one or more bits from a hardware driven number.

30. The random bit stream generator of claim 26 wherein the combining means comprises:

concatenating means for bit-wise concatenating the extracted portions into a concatenated value; and de-skewing means for de-skewing the concatenated value in order to result in a uniform distribution of random bits.

* * * * *

UNITED STATES PATENT AND TRADEMARK OFFICE
CERTIFICATE OF CORRECTION

PATENT NO. : 7,421,462 B2
APPLICATION NO. : 10/706172
DATED : September 2, 2008
INVENTOR(S) : Jose Castejon-Amenedo et al.

It is certified that error appears in the above-identified patent and that said Letters Patent is hereby corrected as shown below:

In column 9, line 1, in Claim 2, delete "a" and insert -- the --, therefor.

In column 9, line 5, in Claim 3, delete "a" and insert -- the --, therefor.

In column 9, line 8, in Claim 4, delete "a" and insert -- the --, therefor.

In column 9, line 10, in Claim 4, delete "the" and insert -- a --, therefor.

In column 9, line 10, in Claim 4, after "of" insert -- the plurality of --.

In column 9, line 13, in Claim 4, after "of" insert -- the plurality of --.

In column 9, line 15, in Claim 5, delete "a" and insert -- the --, therefor.

In column 9, line 20, in Claim 6, after "each" insert -- hardware driven --.

In column 9, line 22, in Claim 6, delete "the" and insert -- a --, therefor.

In column 9, line 36, in Claim 8, insert -- a -- before "time".

In column 9, line 37, in Claim 8, insert -- a -- before "buffer".

In column 9, line 39, in Claim 9, after "more" delete "of the".

In column 9, line 41, in Claim 10, delete "comprises" and insert -- comprising --, therefor.

In column 9, line 43, in Claim 10, insert -- a -- before "time base generator".

In column 9, line 44, in Claim 10, insert -- a -- before "translation".

In column 9, line 49, in Claim 10, delete "the" and insert -- an --, therefor.

UNITED STATES PATENT AND TRADEMARK OFFICE
CERTIFICATE OF CORRECTION

PATENT NO.         : 7,421,462 B2
APPLICATION NO. : 10/706172
DATED                   : September 2, 2008
INVENTOR(S)        : Jose Castejon-Amenedo et al.

It is certified that error appears in the above-identified patent and that said Letters Patent is hereby corrected as shown below:

In column 9, lines 56-57, in Claim 11, delete "input port" and insert -- one or more input ports --, therefor.

In column 9, line 57, in Claim 11, delete "output port" and insert -- of the output ports --, therefor.

In column 9, line 61, in Claim 12, insert -- the -- before "hardware".

In column 10, line 19, in Claim 14, delete "capable of generating" and insert -- that generates --, therefor.

In column 10, line 26, in Claim 15, delete "a" and insert -- the --, therefor.

In column 10, line 30, in Claim 16, delete "extract a" and insert -- to extract the --, therefor.

In column 10, line 31, in Claim 16, delete "a" and insert -- the --, therefor.

In column 10, line 32, in Claim 16, delete "a" and insert -- the --, therefor.

In column 10, line 44, in Claim 18, delete "a portion of a" and insert -- the portion of the --, therefor.

In column 10, line 48, in Claim 19, delete "Module" and insert -- module --, therefor.

In column 11, line 18, in Claim 23, insert -- the -- before "hardware".

In column 11, line 19, in Claim 23, delete "accumulate" and insert -- accumulated --, therefor.

In column 11, line 31, in Claim 25, delete "a" and insert -- the --, therefor.

UNITED STATES PATENT AND TRADEMARK OFFICE
CERTIFICATE OF CORRECTION

PATENT NO. : 7,421,462 B2
APPLICATION NO. : 10/706172
DATED : September 2, 2008
INVENTOR(S) : Jose Castejon-Amenedo et al.

It is certified that error appears in the above-identified patent and that said Letters Patent is hereby corrected as shown below:

In column 12, line 6, in Claim 26, after "driven" insert -- number --.

In column 12, line 17, in Claim 28, after "of" insert -- the --.

In column 12, line 18, in Claim 28, after "time" insert -- , --.

Signed and Sealed this

Eleventh Day of August, 2009

David J. Kappos
*Director of the United States Patent and Trademark Office*